United States Patent
Wu

(10) Patent No.: US 6,197,650 B1
(45) Date of Patent: Mar. 6, 2001

(54) METHOD FOR FORMING CAPACITOR

(75) Inventor: Kun-Lin Wu, Tai-Chung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/314,630

(22) Filed: May 15, 1999

(51) Int. Cl.[7] .................................................. H01L 21/20
(52) U.S. Cl. ............................................ 438/386; 438/396
(58) Field of Search .................................. 438/386, 396, 438/253, 618, 622, 626, 648

(56) References Cited

U.S. PATENT DOCUMENTS 5,926,359 * 6/2000 Greco et al. ........................ 361/311
6,081,021 * 6/2000 Gambino et al. .................... 257/530

* cited by examiner

Primary Examiner—David Nelms
Assistant Examiner—Quoc Hoang
(74) Attorney, Agent, or Firm—Bacon & Thomas, PLLC

(57) ABSTRACT

A method for forming capacitor is proposed. The key point of the invention is that bottom plate and dielectric layer of capacitor are formed before metal interconnect is formed. Thus, thermal treatment of dielectric layer does not affect metal interconnect. Therefore, conventional fault that quality of dielectric layer is degraded by scant annealing is avoided, and then dielectric layer and metal interconnect can be optimized respectively. Obviously, the ultimate advantage of the proposed method is that not only breakdown voltage of dielectric layer is increased by annealing but also quality of metal interconnect is not affected by annealing. Therefore, an incidental advantage of the proposed method is that the method is beneficial to form both capacitor and metal interconnect.

20 Claims, 4 Drawing Sheets

METHOD FOR FORMING CAPACITOR

BACKGROUND OF THE INVENTION

1. Field of the Invention

The present invention relates to a method for forming capacitor, and more particularly to a method that improves quality of capacitor by annealing dielectric layer before metal interconnect is formed.

2. Description of the Prior Art

Capacitors are used extensively in electronic devices for storing electric chargers. Applications of capacitors comprise memories, filters, analog-to-digital converters and various control devices. The capacitors essentially comprise two conductive plates and an insulator that locates between two conductive plates. Moreover, the capacitance, or amount of charges held by the capacitor per applied voltage, is measured in farads and depends upon the area of the conductive plates, the distance between conductive plates and the dielectric value (K) of the insulator.

The material of conductive plates of capacitor comprises polysilicon, polycide and metal. Polysilicon is conventional material but metal plate is a current trend for quality of capacitor with metal plate is better than conventional capacitor with polysilicon plate. In current metal-insulator-metal capacitor, bottom plate of capacitor is widespread either provided by a metal layer or is formed on a metal layer. Where metal layer is used to form metal interconnect and material of metal layer comprises Al and Cu. Beside, insulator layer is widespread provided by a dielectric layer, especially by a high K dielectric layer.

Obviously, for conventional metal-insulator-metal capacitor as FIG. 1 shows. First, a plurality of metal interconnects 11 are formed on substrate 10, where material of metal interconnects 11 comprises Al and Cu. Second, bottom plate 12, dielectric layer 13 and top plate 14 are formed on one interconnect 11 in sequence to form the metal-insulator-metal capacitor, where leakage current and breakdown voltage of dielectric layer 13 is improved by annealing process. Beside, substrate 10 is covered by inter-layer dielectric 15, and vias 16 are formed to connect interconnects 11 and the metal-insulator-metal capacitor. Moreover, surface of inter-dielectric layer 15 is planarized and a plurality of second interconnects 17 are formed on the surface. Of course, sometime bottom plate 12 is provided by one metal interconnect 11.

Obviously, there is a serious drawback that metal interconnects 11 are formed before formation of dielectric layer 13. Because quality of dielectric layer 13 is improved by annealing but quality of metal interconnects 11 is degraded by thermal treatment, it is impossible to acquire both good metal interconnects 13 and good metal-insulator-metal capacitor.

Obviously, when integration of integrated circuit is increased, areas of bottom plate 12 and top plates 14 are diminished. Then previous drawback is more serious for capacitance of capacitor can not be enhanced by annealing dielectric layer 13 to increase dielectric value of dielectric layer 13.

It should be noted that previous drawback not only is serious for metal capacitor, it is serious for any capacitor that dielectric layer is formed after metal line.

According to previous discussion, it is crystal-clear that in order to increase capacitance of capacitor and forms both high capacitance capacitor and low resistance metal interconnect. It is desired to develop a method that overcomes the drawback that dielectric layer can not be improved by annealing for surrounding metal interconnect is degraded by annealing.

SUMMARY OF THE INVENTION

The primary object of the present invention is to propose a method that forms capacitor, and more particular to a method that forms metal capacitor of integrated circuit.

A further object of the present invention is to propose a method that enhances capacitance of capacitor by improving quality of dielectric layer of capacitor and without degrading quality of metal interconnect.

The spirit of the proposed invention is that dielectric layer and anneal dielectric layer are formed before metal interconnect is formed. Thus, thermal treatment of dielectric layer does not affect metal interconnect, and then breakdown voltage is increased by annealing without any side effect on the metal interconnect. Therefore, both high capacitance capacitor and low resistance metal interconnect are acquired. Obviously, the present invention is suitable for any capacitor that dielectric layer is improved by heat treatment. Beside, it should be noted that capacitor formed by the proposed invention never locates on metal interconnect which is an obvious difference with conventional metal capacitor.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

In order to illustrate the proposed invention, a method for forming capacitor and interconnect is provided as an embodiment. The embodiment comprises following steps and is interpreted with six figures.

Figure 1:
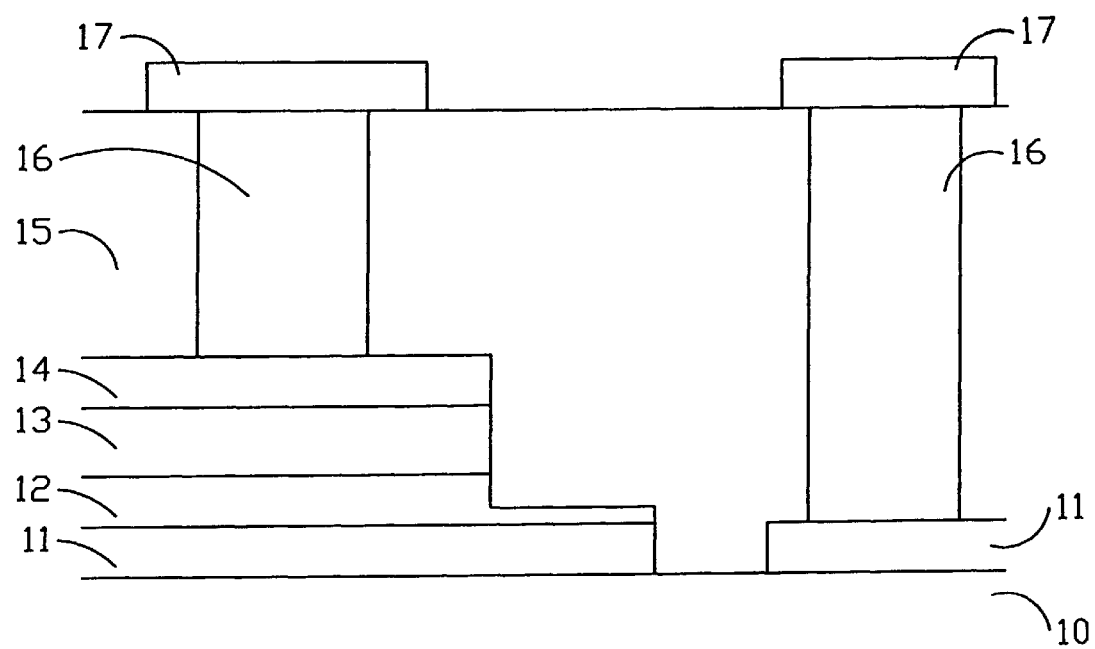
FIG. 1 is a cross sectional diagram of both the capacitor and the interconnect of the conventional fabrication.
Figure 2A:
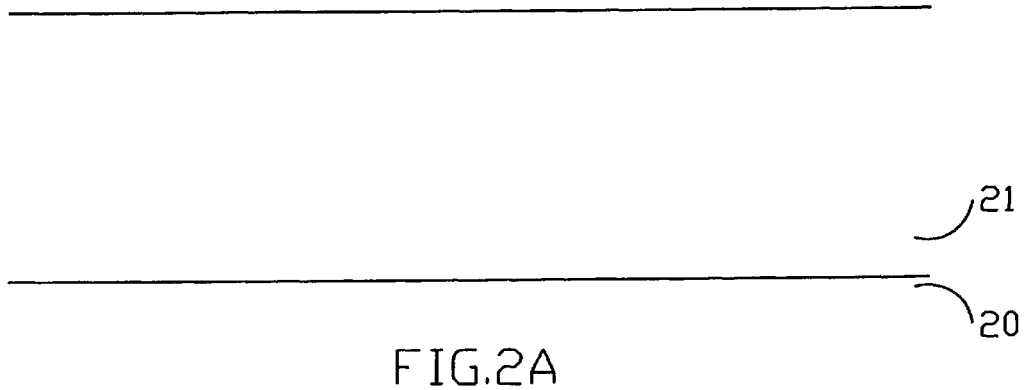
FIG. 2A to FIG. 2F are cross-sectional diagrams illustrating various steps in the formation of the capacitor of the present invention.

First, as FIG. 2A shows, first dielectric layer 21 is formed on substrate 20, where surface of first dielectric layer 21 is planarized. Herein, planarization of surface of first dielectric layer 21 comprises chemical mechanical process, and material of first dielectric layer 21 comprises oxide and low K material. Beside, substrate 20 comprises gate, transistor, interconnect and isolation.

Figure 2B:
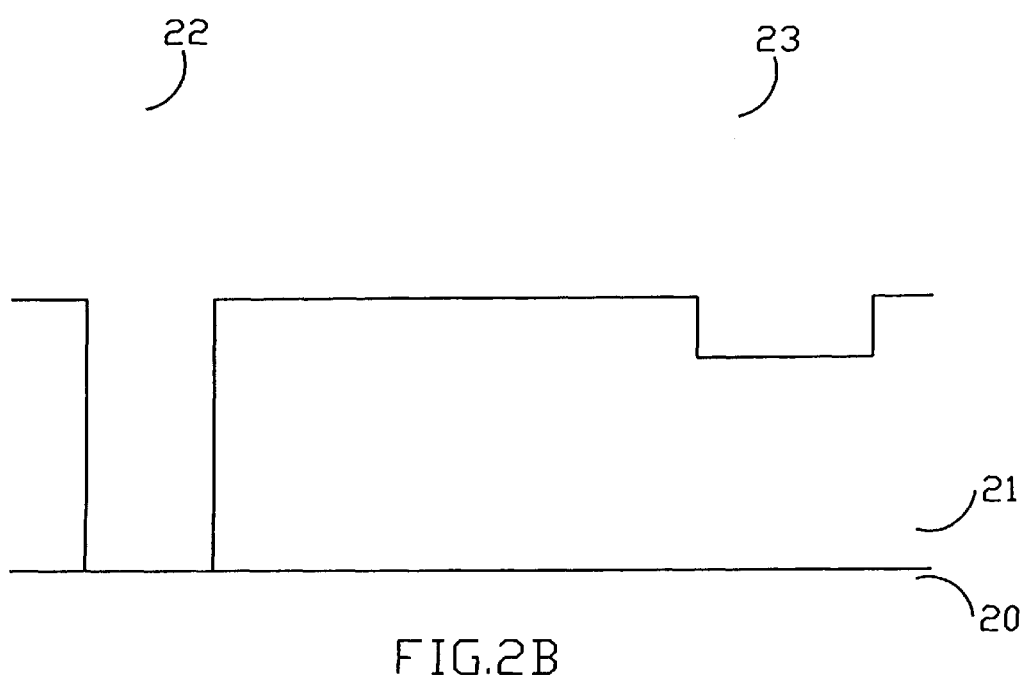

Second, as shown in FIG. 2B, first gap 22 and second gap 23 are formed in first dielectric layer 21. Herein, first gap 22 is corresponding to the contact and second gap 23 is corresponding to the metal capacitor. Moreover, the embodiment further comprises formation of interconnect, where interconnect locates inside first dielectric layer 21 and is used to connect second gap 23 to either a structure in first dielectric layer 21 or a structure in substrate 20, said structure comprises gate, transistor, contact and interconnect.

Figure 2C:
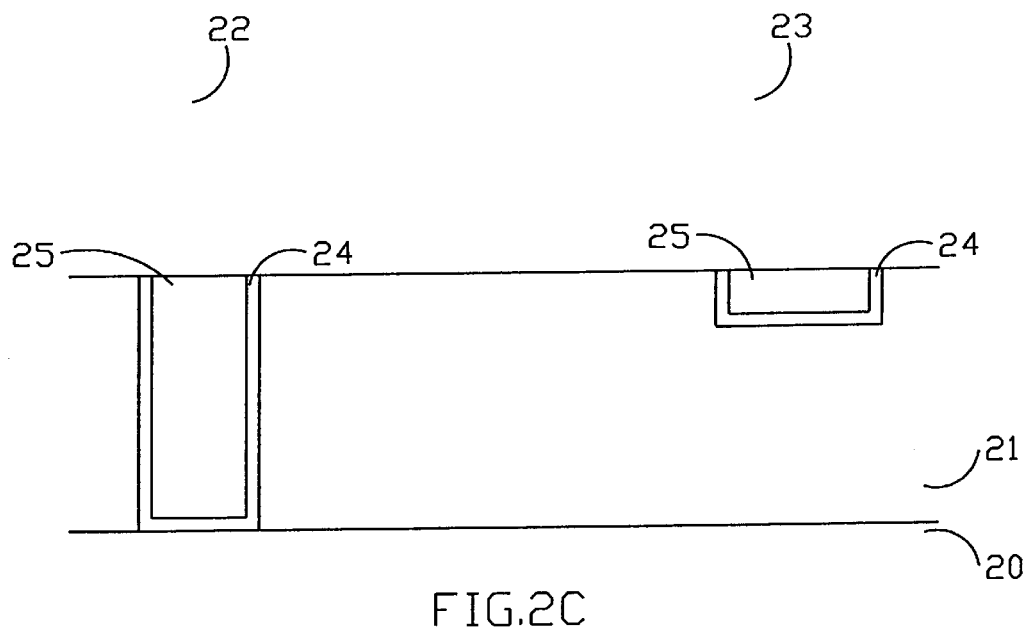

Referring to FIG. 2C, metal glue layer 24 is formed on first dielectric layer 21 and then first metal layer 25 is formed on metal glue layer 24, where first metal layer 25 completely filling first gap 22 and second gap 24. Afterward, removes excess first metal layer 25 and excess metal glue layer 24 by chemical mechanical polish. Moreover, material of glue layer 24 comprises Ti, TiN, Ta, TaN, WSiN and WN. Beside, material of first metal layer 25 comprises W, Al, Cu, TiN, WSi and TiSi.

Figure 2D:
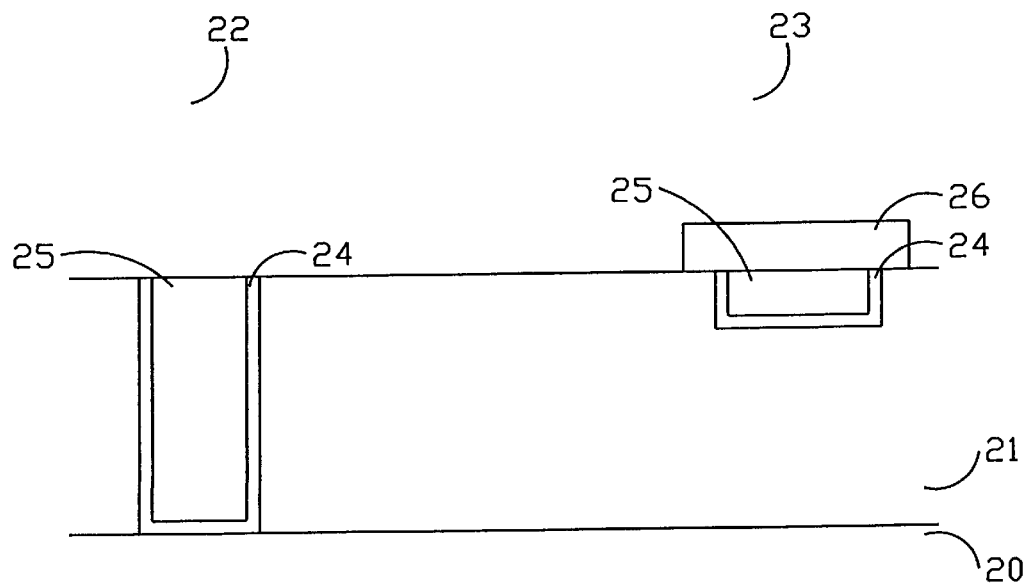

Consequently, referring to FIG. 2D, second dielectric layer 26 is formed on first dielectric layer 21. Subsequently, treats second dielectric layer 26 by annealing to improve quality of second dielectric layer 26 such that leakage current is decreased and breakdown voltage is increased. Herein, method for performing annealing comprises rapid thermal process and furnace, where annealing temperature and annealing time are dependent on specific material of second dielectric layer 26. Thereafter, defines part of second dielectric layer 26 where the part of second dielectric layer 26 is corresponding to second gap 23, and then removes excess second dielectric layer 26 to form insulator of capacitor, where capacitor locates on second gap 23.

Furthermore, material of second dielectric layer 26 comprises high K material layer and ONO composite dielectric tri-layer. Where high K material comprises ferroelectric material, PbTiO3, SrTiO3, BaTiO3, and lead zirconate titanate (PZT). And high K means that K is not smaller than four. On the other hand, the ONO composite dielectric tri-layer is provided by three adjacent dielectric layers, where the middle layer is SiN layer and the others are oxide layers.

In addition, because annealing process not only affects second dielectric layer 26 but also affects residual first metal layer 25. It is noted that both the annealing process and material of first metal layer 25 are adjusted to prevent residual first metal layer 25 is degraded. Owing to the object of the annealing process is to improve quality of second dielectric layer 26 by heat treatment, it is better to form first metal layer 25 with high melting temperature metal such as W.

Figure 2E:
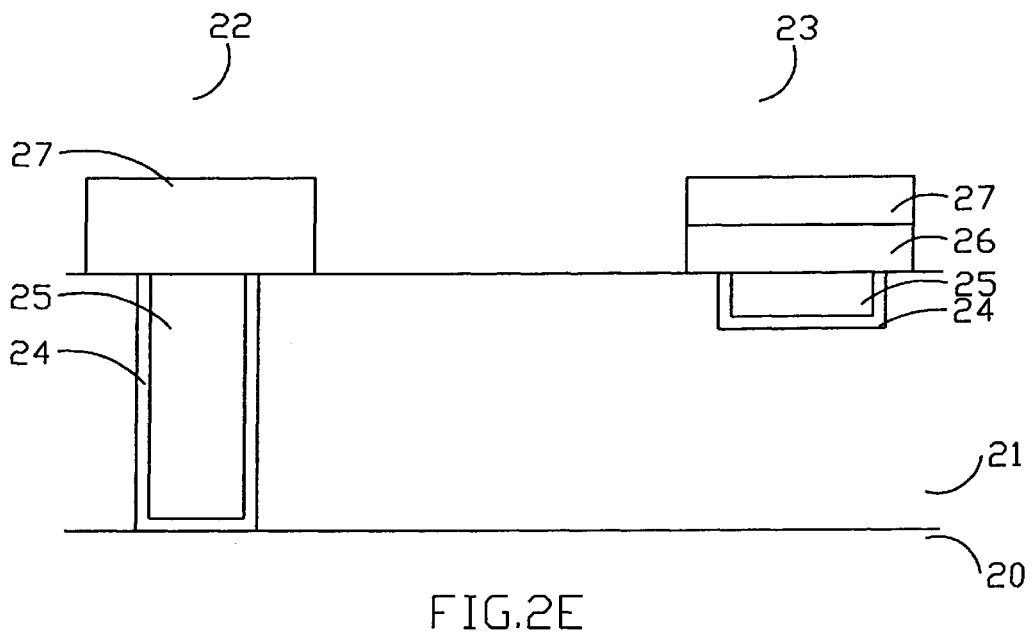

Next, as shown in FIG. 2E, second metal layer 27 is formed on first dielectric layer 21 and covers residual second dielectric layer 26, where material of second metal layer 27 comprises Al and Cu. Then, defines part of second metal layer 27 that corresponds to first gap 22 and the part of second dielectric layer 26. Therefore, removes excess second metal layer 27 to form metal interconnect and top plate of capacitor, where metal interconnect locates on first gap 22 and top plate of capacitor locates on second dielectric layer 26.

Figure 2F:
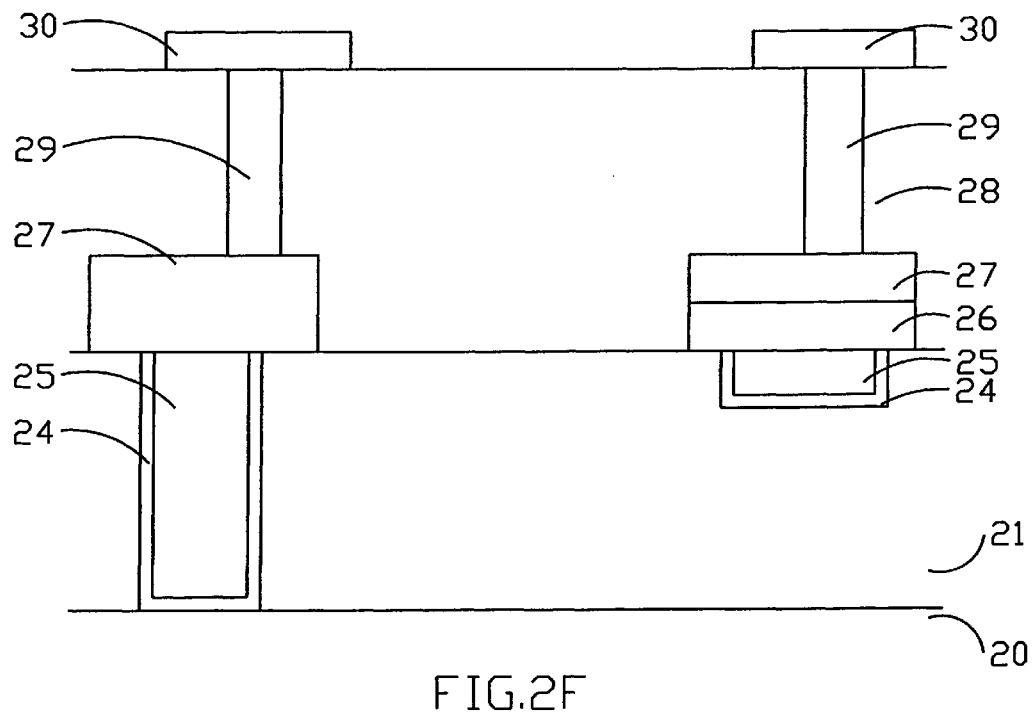

Finally, as shown in FIG. 2F, third dielectric layer 28 is formed on first dielectric layer 21, third dielectric layer 28 also covers second metal layer 27, where material of third dielectric layer 28 comprises low K material and oxide. Then, planarizes surface of third dielectric layer 28, forms a plurality of vias 29 that connect to residual second metal layer 27. Afterwards, forms third metal layer 30 on third dielectric layer 28, defines part of third metal layer 30 that corresponds 29 vias, and removes excess third metal layer 30. In addition, material of third metal layer 30 comprise Al and Cu.

Of course, though material of metal interconnect is equal to material of top plate of capacitor in the embodiment, it is not necessary for the proposed invention. In other words, though material of metal interconnect are AL or Cu to increase conductivity, but material of top plate of capacitor can be any high melting temperature metal such as W.

According to previous discussion, it is obvious that second dielectric layer 26 is formed before formation of second metal layer 27. Thus, thermal treatment of second dielectric layer 26 such as annealing does not affect second metal layer 27. Therefore, quality of second dielectric layer 26 always is improved by sufficient annealing, and then second dielectric layer 26 and second metal layer 27 can be optimized respectively. Obviously, not only breakdown voltage of second dielectric layer 26 is increased by annealing but also quality of second metal layer 27 is not affected by annealing. Therefore, an incidental advantage of the proposed method is that both capacitor and metal interconnect can be formed by the proposed invention. Beside, it should be noted that capacitor formed by the proposed invention never locates on metal interconnect which is an obvious difference with conventional metal capacitor.

While the invention has been described by way of example and in terms of preferred embodiment, the invention is not limited there to. To the contrary, it is intended to cover various modifications, procedures and products, and the scope of the appended claims therefore should be accorded to the broadest interpretation so as to encompass all such modifications and similar arrangement, procedures and products.

What is claimed is:

1. A method for forming capacitor and interconnect, said method comprising:
   providing a substrate;
   forming a first dielectric layer on said substrate;
   planarizing surface of said first dielectric layer;
   forming a first gap and a second gap in said first dielectric layer, wherein said first gap corresponds an contact and said second gap corresponds a metal capacitor;
   forming a metal glue layer on said first dielectric layer;
   forming a first metal layer on said metal glue layer, said first metal layer completely filling both said first gap and said second gap;
   removing excess said first metal layer and excess said metal glue layer by chemical mechanical polish;
   forming a second dielectric layer on said first dielectric layer;
   annealing said second dielectric layer;
   defining part of said second dielectric layer, said part of said second dielectric layer corresponds said second gap;
   removing excess said second dielectric layer;
   forming a second metal layer on said first dielectric layer, said second metal layer also covering said second dielectric layer;
   defining part of said second metal layer, said part of said metal layer corresponds to both said first gap and said part of said second dielectric layer;
   removing excess said second metal layer;
   forming a third dielectric layer on said first dielectric layer, said third dielectric layer covering said second metal layer;
   planarizing surface of said third dielectric layer;
   forming a plurality of vias, said vias connects to said part of said second metal layer;
   forming a third metal layer on said third dielectric layer;
   defining part of said third metal layer that corresponds said vias; and
   removing excess third metal layer.

2. The method according to claim 1, wherein planarization of surface of said first dielectric layer comprises chemical mechanical process.

3. The method according to claim 1, wherein material of said first dielectric layer comprises oxide and low K material.

4. The method according to claim 1, wherein material of said glue layer comprises Ti, TiN, Ta, TaN, WSiN and WN.

5. The method according to claim 1, wherein material of said first metal layer comprises W, Al, Cu, TiN, WSi and TiSi.

6. The method according to claim 1, wherein said second dielectric layer comprises high K material layer and ONO composite dielectric tri-layer.

7. The method according to claim 1, wherein said high K material layer comprises ferroelectric material layer, wherein said high K means that K is not smaller than 4.

8. The method according to claim 1, wherein said ONO composite dielectric tri-layer is provided by three adjacent dielectric layers, where the middle layer is SiN layer and the others are oxide layers.

9. The method according to claim 1, wherein method of said annealing comprises rapid thermal process and furnace.

10. The method according to claim 1, wherein material of said second metal layer comprises Al and Cu.

11. The method according to claim 1, wherein material of said third dielectric layer comprises low K material and oxide.

12. The method according to claim 1, wherein material of said third metal layer comprises Cu and Al.

13. The method according to claim 1, wherein said first dielectric layer further comprises interconnect that connects said second gap and a structure on said substrate, said structure comprises gate, transistor and interconnect.

14. A method for forming metal capacitor for an integrated circuit, said method comprising:

forming a first dielectric layer on a substrate, surface of said first dielectric layer is planarized;

forming a gap;

forming a metal glue layer on said first dielectric layer;

forming a first metal layer on said metal glue layer and completely filling said gap;

removing excess said first metal layer and excess said metal glue layer by chemical mechanical polish;

forming a second dielectric layer on said first dielectric layer;

heat treating said second dielectric layer by rapid thermal process;

defining part of said second dielectric layer that corresponds said gap;

removing excess said second dielectric layer;

forming a second metal layer on said first dielectric layer;

defining part of said second metal layer that corresponds said part of said second dielectric layer;

removing excess said second metal layer;

depositing an inter metal dielectric layer on said first dielectric layer, wherein said inter metal dielectric layer totally covers said second metal layer;

planarizing surface of said inter metal dielectric layer; and performing subsequent metallization process.

15. The method according to claim 14, wherein material of said glue layer comprises Ta, Ti, TaN, TiN, WSiN and WN.

16. The method according to claim 14, wherein material of said first metal layer comprises W, Al, Cu, TiN, WSi and TiSi.

17. The method according to claim 14, wherein material of said second dielectric layer comprises composite tri-layers dielectric and S high K material.

18. The method according to claim 14, wherein said tri-layers dielectric is provided by three adjacent dielectric layers, where the intermediate layer is SiN layer and the others are oxide layers.

19. The method according to claim 14, wherein said high K means that K is not smaller than 4, and said high K material comprises ferroelectrics, PbTiO3, SrTiO3, BaTiO3 and PZT.

20. The method according to claim 14, wherein said second metal layer comprises Al layer and Cu layer.

* * * * *